United States Patent
Mathis et al.

(10) Patent No.: US 7,652,608 B1
(45) Date of Patent: *Jan. 26, 2010

(54) CHANNELIZED ANALOG-TO-DIGITAL CONVERTER

(75) Inventors: Ronald F. Mathis, Ramona, CA (US); Stephen R. Mathis, Menifee, CA (US); Paul N. Huntley, Poway, CA (US); James A. Crawford, San Diego, CA (US); Barry L. Dorr, Carlsbad, CA (US); William L. Floyd, Temecula, CA (US)

(73) Assignee: Photonics Products, Inc., Murrieta, CA (US)

( * ) Notice: Subject to any disclaimer, the term of this patent is extended or adjusted under 35 U.S.C. 154(b) by 305 days.

This patent is subject to a terminal disclaimer.

(21) Appl. No.: 11/298,035

(22) Filed: Dec. 9, 2005

Related U.S. Application Data

(63) Continuation of application No. 10/820,168, filed on Apr. 7, 2004, now Pat. No. 6,980,147.

(60) Provisional application No. 60/460,997, filed on Apr. 7, 2003, provisional application No. 60/479,094, filed on Jun. 17, 2003.

(51) Int. Cl.
*H03M 1/12* (2006.01)

(52) U.S. Cl. .................. 341/155; 341/110; 341/126; 455/307; 455/337; 375/254; 375/364

(58) Field of Classification Search .................. 341/126, 341/155, 141; 375/245, 247, 316
See application file for complete search history.

(56) References Cited

U.S. PATENT DOCUMENTS

| | | | | |
|---|---|---|---|---|
| 1,059 | A | 12/1838 | Konig | |
| H1059 | H * | 5/1992 | Konig | 398/202 |
| 5,963,889 | A * | 10/1999 | Irregger et al. | 702/124 |
| 5,963,899 | A | 10/1999 | Bayya et al. | |
| 6,075,820 | A * | 6/2000 | Comino et al. | 375/245 |
| 6,323,797 | B1 * | 11/2001 | Kikumoto et al. | 341/144 |
| 6,339,390 | B1 * | 1/2002 | Velazquez et al. | 341/120 |

(Continued)

OTHER PUBLICATIONS

"Theory and Design of *M*-Channel Maximally Decimated Quadrature Mirror Filters with Arbitrary *M*, Having the Perfect-Reconstruction Property", by P.P. Vaidyanathan,; *IEEE Transactions on Acoustics, Speech, and Signal Processing*, vol. ASSP-35, No. 4, Apr. 1987.

*Primary Examiner*—Linh V Nguyen
(74) *Attorney, Agent, or Firm*—Stout, Uxa, Buyan & Mullins, LLP; Donald E. Stout

(57) ABSTRACT

A waveform acquisition system that captures and digitizes a wideband electrical signal through a bank of front end filters, frequency down converters, and conventional digitizers (A/D converters). A software algorithm reconstructs the composite input signal and applies the necessary corrections to remove the effects of hardware impairments. This approach is possible because it uses a class of filters that exhibit the quality of perfect waveform reconstruction, allowing signals whose spectral components overlap multiple filter bands, to be faithfully reconstructed. A calibration generator switched into the input port serves as a reference for quantifying and removing hardware errors. The channelized analog-to-digital converter (ADC) effectively multiplies the bandwidth and sampling rate of the conventional digitizer performance in a single channel by the number of channels in the system.

12 Claims, 1 Drawing Sheet

U.S. PATENT DOCUMENTS

| | | | |
|---|---|---|---|
| 6,380,879 B2 * | 4/2002 | Kober et al. | 341/155 |
| 6,411,653 B1 | 6/2002 | Arunachalam et al. | |
| 6,463,450 B1 | 10/2002 | Balachandran et al. | |
| 6,473,013 B1 * | 10/2002 | Velazquez et al. | 341/120 |
| 6,476,754 B2 * | 11/2002 | Lowenborg et al. | 341/155 |
| 6,492,914 B2 | 12/2002 | Katoh | |
| 6,532,256 B2 | 3/2003 | Miller | |
| 6,580,795 B1 * | 6/2003 | Li et al. | 379/406.14 |
| 6,806,820 B1 * | 10/2004 | Dhalla et al. | 341/144 |
| 6,868,377 B1 * | 3/2005 | Laroche | 704/205 |
| 6,963,842 B2 * | 11/2005 | Goodwin | 704/500 |
| 7,177,369 B2 * | 2/2007 | Crilly, Jr. | 375/296 |
| 7,289,053 B2 * | 10/2007 | Bunin | 341/156 |
| 7,324,036 B2 * | 1/2008 | Petre et al. | 341/155 |
| 2001/0000216 A1 * | 4/2001 | Kober et al. | 341/155 |
| 2004/0042531 A1 * | 3/2004 | Arikan et al. | 375/148 |

\* cited by examiner

CHANNELIZED ANALOG-TO-DIGITAL CONVERTER

RELATED APPLICATIONS

This application is a continuation under 35 U.S.C. 120 of U.S. patent application Ser. No. 10/820,168, filed on Apr. 7, 2004, and now U.S. Pat. No. 6,980,147, which in turn claimed the benefit, under 35 U.S.C. 119, of the filing date of U.S. provisional patent application Ser. No. 60/460,997, filed on Apr. 7, 2003, and provisional patent application Ser. No. 60/479,094, filed on Jun. 17, 2003. Each of these applications are herein expressly incorporated by reference.

GOVERNMENT RIGHTS

The U.S. Government has a paid-up license in this invention and the right in limited circumstances to require the patent owner to license others on reasonable terms as provided for by the terms of Contract no. MDA904-03-C-0418.

BACKGROUND OF THE INVENTION

The present invention pertains to the conversion of analog signals to digital format. It is particularly applicable for capturing wideband signals where the desired dynamic range of the system cannot be achieved by existing analog to digital converters. There are many applications where the system is limited by the dynamic range of the digitizer. Some of the applications with this limitation include specific emitter identification (SEI) systems, high frequency test equipment, and CDMA cell towers.

The conversion speed and dynamic range of conventional digitizers is limited by several factors. An article authored by R. H. Walden, and entitled *Analog-to-Digital Converter Survey and Analysis*, published in IEEE Communications, Vol. 17, No. 4, pp. 539-550, April 1999, aptly describes these factors and shows that as the sampling rate increases, the dynamic range degrades. In particular, the dynamic range decreases by one effective bit (6.02 dB) for each octave increase in instantaneous bandwidth. There has been significant effort put toward finding a solution around this digitizer limitation. Most of the solutions involve time interleaving multiple digitizers together so that they each sample one after the other. This allows for a sampling rate beyond the performance of only one digitizer, but it does not get around the problem caused by the time aperture window of each sample. According to the aforementioned article, this time aperture window, known as jitter, is the primary limitation to the dynamic range of a digitizer.

One way to get around the jitter limitation is to filter the signal into frequency slices or channels and then mix the frequency channels down to baseband where they are digitized by slower digitizers. This type of channelized design can get around the jitter limitation because each digitizer is sampling a much narrower band signal at a lower frequency. The channelized system is dependent on the stability of the local oscillators for the mixers rather than the digitizer. The stability of a frequency oscillator can be much greater than the jitter of a digitizer, so combining the channels is, in effect, multiplying the performance of the digitizers used to sample the channels.

Channelized systems have been attempted for many years, but have not been successful for several reasons. First and foremost is the difficulty of coherently recombining the channels together. Most RF filters cause significant distortion to the signal information at the band edges. Coherently combining the band edges of adjacent filters has proved to be an impossible task prior to this invention. The second difficulty involves aligning the channels in time and knowing the phase of each local oscillator during the signal acquisition. The final difficulty is removing the amplitude and phase distortions that are introduced by the RF and electronic elements in the system. These three difficulties combined have made the realization of a channelized system impossible prior to this invention.

SUMMARY OF THE INVENTION

The present invention addresses the limitations described above in channelizing the signal, frequency down-converting to allow each band to be sampled at a lower rate, digitizing, and then reconstructing the signal. Although the technique of channelizing is not new, the present invention describes a method of implementing this technique so that captured information in overlapping multiple channels can be recombined to faithfully reconstruct the input signal. A key to the present invention is the use of a specially designed set of M-band filters that have a perfect reconstruction property. (Perfect reconstruction means that the sum of the cascaded responses of the M-band analysis filters followed by the synthesis filters produces an overall flat amplitude response and group delay.) One disclosed embodiment employs a set of four M-band filters. The output of each filter is mixed down to a lower frequency. Once converted to a lower frequency, the digitizer, operating at a proportionally lower sample rate, provides an improved dynamic range. The signals are equalized and reconstructed with a set of M-band synthesis filters in software. The dynamic range of the low frequency digitizers is maintained after the channels are recombined due to the summation of both signal and noise power from each channel.

The M-band filter theory provides a theoretical basis for coherently recombining the channels, but for this theory to be realized, the channels have to be aligned in time and phase, and the phase of the mixer LO at the time of the capture must be known. The channel alignment is achieved through the use of a calibration signal that is injected into the input port. The preferred embodiment injects this signal at the end of each capture event. With this method, the LO phase and the timing errors between channels can be determined at the exact time at which the signal was captured.

The sequence of operation begins with an electrical input signal that is received and filtered into a plurality of bands. The bands are converted to a lower frequency range through a set of complex down converters and digitized by a bank of conventional digitizers. After applying the appropriate corrections to the captured data, a software algorithm mathematically converts each band back to its original frequency. Finally, each band is passed through a digital synthesis filter and summed to form the reconstructed waveform. A calibration generator switched into the input port serves as a reference for quantifying and removing hardware errors. An optional detector can be used to trigger the waveform capturing sequence.

The invention, together with additional features and advantages thereof, may best be understood by reference to the following detailed description taken in conjunction with the accompanying illustrative drawings.

DETAILED DESCRIPTION OF THE INVENTION

Figure 1:
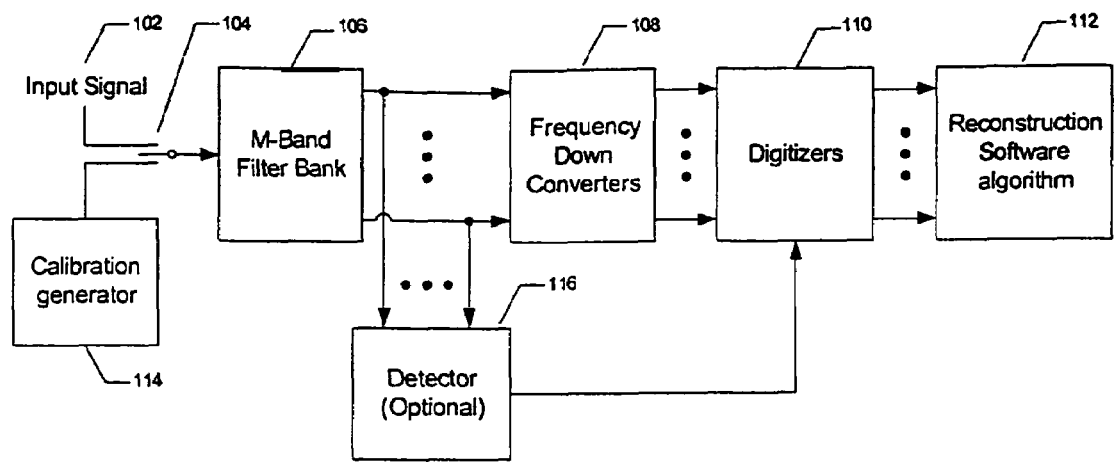
FIG. 1 is a functional block diagram of the essential portions of a channelized analog-to-digital converter (ADC) constructed in accordance with the principles of the present invention.

Referring first to FIG. 1, a functional block diagram illustrates one embodiment of the high speed, channelized, analog-to-digital converter of the present invention. The converter includes an input signal 102, a switch 104, an M-band filter bank 106, frequency down converters 108, a set of conventional digitizers 110, and reconstruction software algorithms 112. During each capture sequence, a calibration generator 114 is switched into the input to provide a reference for quantifying and removing hardware errors. An optional detector 116 may be connected either at the input or the output of the M-band filter bank 106 in order to trigger the waveform capturing sequence.

The M-band perfect reconstruction technique requires two sets of filters, namely an analysis filter set and a synthesis filter set. The analysis filter set consists of M filters that divide the frequency range into M sub-bands. The synthesis filter set consists of filters that map to each of the filters in the analysis filter set. Both filter sets are FIR type filters and have a repeating nature so that M may be larger than the physical number of analysis filters. The perfect reconstruction algorithm specifies the filter coefficients such that the cascade of these filter sets gives an ideally constant amplitude and group delay across all frequencies. The analysis filters may be implemented optically by summing an array of weighted fiber optic delay lines, or they can be implemented in software by shaping (equalizing) the amplitude and phase response of filtered or unfiltered channels into the ideal analysis filter response. In the case of filtered or unfiltered channels the anti aliasing filter in front of the digitizer serves as a pre filter. The synthesis filter is implemented in software using conventional signal processing techniques.

Figure 2:
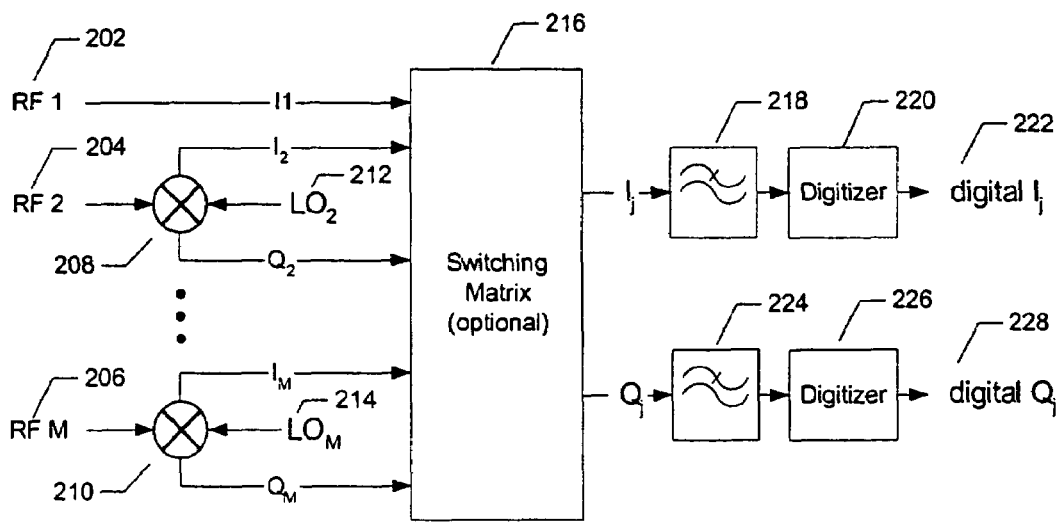
FIG. 2 is a block diagram of the down converter and digitizer components of the present invention.

Following the M-band filter bank 106 is a set of frequency down converters 108 whose purpose is to translate each band of the channelizer to a lower frequency range that can be digitized by conventional digitizers. FIG. 2 illustrates this approach. The M channel inputs 202, 204, and 206 are applied to quadrature down converters 208 and 210, that are driven by local oscillators (LOs) 212 and 214, and applied to a switching matrix 216. Channel 1 typically does not require a down converter if it is already at base band. The frequencies of the LOs are preferably chosen to be at the center of each filter band. Other frequencies are possible such as between adjacent filters. The in-phase (I) and quadrature (Q) output signals of the quadrature down converters contain all information necessary to reproduce the input signal without ambiguity. The optional switching matrix may be used to serially sequence through each channel thereby reducing the number of digitizers. Without this switching matrix, a dedicated digitizer is required for each channel. The output of the switching matrix is applied to low pass anti-alias filters 218 and 224, and then to conventional digitizers 220 and 226. The digital representation of these signals 222 and 228 appears at the output of the digitizers for subsequent processing.

Figure 3:
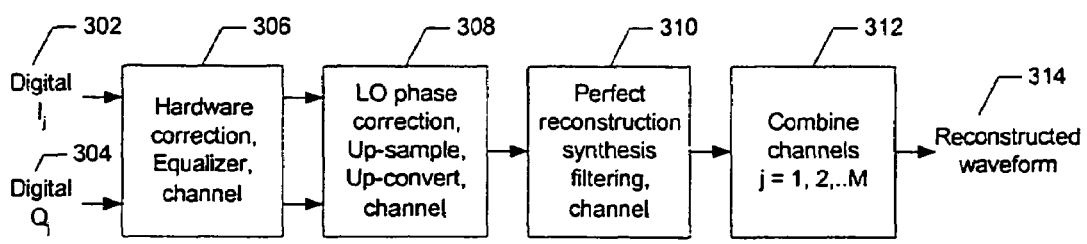
FIG. 3 is a diagram of the software correction and reconstruction algorithm of the present invention.

The final techniques essential for implementing the Channelized ADC are the software correction and reconstruction algorithms illustrated in FIG. 3. The first software algorithm 306 corrects for the effects of hardware impairments on the digital I and Q signals 302 and 304 corresponding to one of the channels. This algorithm takes a measurement of the existing transfer function of each channel, and uses it to create a shaping filter so that the combined response of the transfer function of the channel plus the shaping filter looks like a perfect m-band filter for that channel. The preferred embodiment uses a Weiner filter that has an additional property of suppressing noise. Software algorithm 306 also removes imbalances and DC offsets in the quadrature down converter.

The second software algorithm 308 measures and corrects for the uncertainty of the LO phase in the down converter, and the time delay differences between channels. It extracts this information from a calibration signal that has been injected preferably immediately after the received signal. In alternative embodiments the calibration signal is injected during or after the received signal. In yet another embodiment a continuous calibration signal is injected continuously keeping the system in alignment. The information extraction can be done using various methods including correlation techniques and waveform analysis. Software algorithm 308 also up-samples the data and up-converts each channel to its original frequency. At this point the signal becomes a real time sequence, rather than a complex signal, and is applied to the next block 310 for synthesis filtering according to the perfect reconstruction algorithm. Once this process is completed for each channel, the data are summed via summer 312, and appear at the output as the reconstructed waveform 314.

While the invention herein disclosed has been described by means of specific embodiments and applications thereof, numerous modifications and variations could be made thereto by those skilled in the art without departing from the scope of the invention set forth in the claims.

What is claimed is:

1. A high-speed signal processor which functions as a waveform acquisition system and a high-speed analog-to-digital converter, said processor comprising:

a filter system, comprising an M-band filter bank including M-band analysis filters and M-band synthesis filters, for dividing a single input signal into a series of adjacent frequency bands or channels, wherein M-band filters in said M-band filter bank have a perfect reconstruction property, such that a sum of the cascaded responses of the M-band analysis filters followed by the M-band synthesis filters produces an overall flat amplitude response and group delay;

a frequency down converter for down converting one or more of the adjacent frequency bands as they are output from said filter system, said frequency bands or channels being precisely aligned in time and phase;

a digitizer for baseband sampling each frequency band output from said filter system;

and a system for reconstructing the original input signal.

2. The high-speed signal processor as recited in claim 1, wherein the M-band filters in said M-band filter bank are implemented optically using fiber optics.

3. The high-speed signal processor as recited in claim 1, wherein the M-band filters in said M-band filter bank are implemented electronically.

4. The high-speed signal processor as recited in claim 1, wherein the M-band filters in said M-band filter bank are implemented using software.

5. The high-speed signal processor as recited in claim 1, wherein each channel output is equalized, to thereby shape the transfer function of the channel into that of an M-band filter.

6. The high-speed signal processor as recited in claim 5, wherein the channel equalization is implemented with Weiner filter technology.

7. The high-speed signal processor as recited in claim 1, wherein a calibration signal is continuously injected into said processor to serve as a reference for quantifying and removing hardware errors and to achieve alignment of said channels in time and phase.

8. The high-speed signal processor as recited in claim 7, wherein said calibration signal is injected in a manner such that it passes through the same point as said single input signal, in front of said filter system.

9. The high-speed signal processor as recited in claim 1, wherein the system does not function to remove noise supplied in the single input signal.

10. A method for processing signals, comprising:
dividing a single input signal into a series of adjacent frequency bands or channels, wherein said dividing step is performed using filters having a perfect reconstruction property and said filters comprise an M-band filter bank including M-band analysis filters and M-band synthesis filters, for dividing a single input signal into a series of adjacent frequency bands or channels, wherein M-band filters in said M-band filter bank have a perfect reconstruction property, such that a sum of the cascaded responses of the M-band analysis filters followed by the M-band synthesis filters produces an overall flat amplitude response and group delay;

down-converting each frequency band to allow each band to be sampled at a lower rate;

precisely aligning each band or channel in time and phase;

digitizing each frequency band using baseband sampling; and reconstructing the original input signal.

11. The method as recited in claim 10, and further comprising a step of injecting a calibration signal such that it passes through a common point with the single input signal, prior to the performance of the dividing step.

12. The method as recited in claim 10, wherein none of the steps involve removing noise supplied in the single input signal.

* * * * *

UNITED STATES PATENT AND TRADEMARK OFFICE
CERTIFICATE OF CORRECTION

PATENT NO. : 7,652,608 B1
APPLICATION NO. : 11/298035
DATED : January 26, 2010
INVENTOR(S) : Mathis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 422 days.

Signed and Sealed this

Twenty-third Day of November, 2010

David J. Kappos
*Director of the United States Patent and Trademark Office*